US008349647B2

(12) United States Patent
Ryu et al.

(10) Patent No.: US 8,349,647 B2
(45) Date of Patent: Jan. 8, 2013

(54) THIN FILM TRANSISTORS AND METHODS OF MANUFACTURING THE SAME

(75) Inventors: Myung-kwan Ryu, Yongin-si (KR); Tae-sang Kim, Seoul (KR); Jang-yeon Kwon, Seongnam-si (KR); Kyung-bae Park, Seoul (KR); Kyung-seok Son, Seoul (KR); Ji-sim Jung, Incheon (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 0 days.

(21) Appl. No.: 13/064,080

(22) Filed: Mar. 4, 2011

(65) Prior Publication Data

US 2011/0159646 A1 Jun. 30, 2011

Related U.S. Application Data

(62) Division of application No. 11/987,610, filed on Dec. 3, 2007, now Pat. No. 7,923,722.

(30) Foreign Application Priority Data

May 29, 2007 (KR) ........................ 10-2007-0052226

(51) Int. Cl.
*H01L 21/00* (2006.01)

(52) U.S. Cl. .......... 438/104; 438/85; 438/151; 438/197; 257/43; 257/59

(58) Field of Classification Search .................. 438/104, 438/156, 158, 216, 85, 151, 197; 257/43, 257/59, E21.703
See application file for complete search history.

(56) References Cited

U.S. PATENT DOCUMENTS

| | | | |
|---|---|---|---|
| 6,563,174 B2 | 5/2003 | Kawasaki et al. | |
| 7,049,190 B2 | 5/2006 | Takeda et al. | |
| 7,145,174 B2 * | 12/2006 | Chiang et al. | 257/59 |
| 2004/0023432 A1 | 2/2004 | Haga | |
| 2004/0038446 A1 | 2/2004 | Takeda et al. | |
| 2004/0155270 A1 * | 8/2004 | Hoffman | 257/288 |

FOREIGN PATENT DOCUMENTS

| | | |
|---|---|---|
| KR | 10-2004-0106576 | 12/2004 |
| KR | 10-2006-0123765 | 12/2006 |

\* cited by examiner

*Primary Examiner* — Thinh T Nguyen
(74) *Attorney, Agent, or Firm* — Harness, Dickey & Pierce, P.L.C.

(57) ABSTRACT

A TFT includes a zinc oxide (ZnO)-based channel layer having a plurality of semiconductor layers. An uppermost of the plurality of semiconductor layers has a Zn concentration less than that of a lower semiconductor layer to suppress an oxygen vacancy due to plasma. The uppermost semiconductor layer of the channel layer also has a tin (Sn) oxide, a chloride, a fluoride, or the like, which has a relatively stable bonding energy against plasma. The uppermost semiconductor layer is relatively strong against plasma shock and less decomposed when being exposed to plasma, thereby suppressing an increase in carrier concentration.

12 Claims, 8 Drawing Sheets

THIN FILM TRANSISTORS AND METHODS OF MANUFACTURING THE SAME

PRIORITY STATEMENT

This U.S. nonprovisional application is a divisional of U.S. application Ser. No. 11/987,610, filed on Dec. 3, 2007 now U.S. Pat. No. 7,923,722, which claims priority under 35 U.S.C. §119 to Korean Patent Application No. 10-2007-0052226, filed on May 29, 2007, in the Korean Intellectual Property Office, the entire contents of each of which are incorporated herein by reference.

BACKGROUND

Description of the Related Art

Conventional televisions (TV) displays may be required to satisfy several market requirements such as relatively large size, digital information display (DID), reduced cost, and/or higher quality in image movement, resolution, brightness, contrast and/or color production. To that end, flat panel displays, such as liquid crystal displays (LCDs), and organic light-emitting diodes (OELDs) are increasingly being used in conventional TVs and TV displays. A substrate (e.g., a glass substrate) may be manufactured in relatively large sizes, and thin film transistors (TFTs) having sufficient characteristics may be used as a display switching and driving elements without increasing manufacturing costs.

Amorphous-silicon (a-Si) TFTs may be used as driving and switching elements in conventional displays. In one example, amorphous silicon TFTs may be more uniformly formed on a relatively large substrate of about 2 m or more at relatively low costs. As display size and/or quality increases, however, driving and/or switching devices may require higher performance. As a result, conventional a-Si TFTs having a relatively low electron mobility of approximately 0.5 $cm^2/Vs$ may not be sufficient. Accordingly, relatively high performance TFTs having higher electron mobility than that of the conventional a-Si TFTs may be required.

Performance degradation of conventional a-Si TFTs may also reduce reliability. As a result, using conventional a-Si TFTs for organic light emitting diodes (OLEDs), which emit light in response to a continuously applied current, may be more difficult than for liquid crystal displays (LCDs).

Conventional poly-Si TFTs may have higher performance than a-Si TFTs and a higher mobility of tens to hundreds of $cm^2/Vs$. As a result, poly-Si TFTs may be applied to relatively high quality displays for which conventional a-Si TFTs may not be suitable. In addition, conventional poly-Si TFTs may degrade less than that of conventional a-Si TFTs. However, additional processes and equipment may be required to manufacture conventional poly-Si TFTs as compared to conventional a-Si TFTs. Accordingly, conventional poly-Si TFTs may be limited as well, even though conventional poly-Si TFTs may be more suitable for relatively high quality displays or OLEDs. Additionally, because conventional poly-Si TFTs may not be manufactured on relatively large substrates (e.g., exceeding about 1 m) because of technical problems related to the use of special equipment and relatively poor uniformity, using use conventional poly-Si TFTs for TVs may be more difficult for relatively high performance poly-Si TFTs.

More recently, ZnO-based TFTs have received increasing attention as oxide semiconductor devices. ZnO-based TFTs may include, for example, a zinc oxide ($ZnO_x$) TFT and a gallium-indium-zinc-oxide (GIZO) TFT. GIZO is a mixture of gallium oxide ($GaO_x$), indium oxide ($InO_x$) and zinc oxide ($ZnO_x$). A conventional $ZnO_x$ TFT, which may be polycrystalline, may have relatively high electron mobility similar to that of a poly-Si TFT, but may also have relatively low uniformity. A GIZO TFT, which is amorphous, may have higher characteristics than an a-Si TFT. In addition, the GIZO TFT may be characterized by relatively large design, relatively low manufacturing costs, relatively high uniformity, relatively high performance and relatively high reliability because the GIZO TFT may be manufactured in the same or substantially the same manner as the a-Si TFT.

Because a GIZO semiconductor film is amorphous, the GIZO semiconductor film may be processed at relatively low temperatures and may be formed in relatively large sizes. However, carrier concentration in a conventional ZnO-based semiconductor film including the GIZO semiconductor film is sensitive to changes in oxygen concentration. As a result, physical and electrical properties of the ZnO-based semiconductor film may be affected by thermal and/or chemical shock. When manufacturing a ZnO-based TFT, the ZnO-based semiconductor film may be exposed to relatively high-energy plasma. At this time, oxygen vacancy may occur in the semiconductor film due to the decomposition of ZnO. This may result in an increase in the carrier concentration.

In one example, a bottom gate Zn-based transistor may include ohmic layers corresponding to both source and drain electrodes, similar to a conventional silicon transistor. The ohmic layers may be formed by plasma treatment, for example, using oxygen plasma treatment. A back channel layer having relatively high conductivity may be formed between the source and drain electrodes when forming the ohmic layers. The back channel layer may be partially removed in a subsequent patterning process for the source and drain electrodes, and the remaining back channel layer may be exposed to plasma in a subsequent passive layer forming process, which may damage a surface of the channel layer.

An increase in the carrier concentration due to the damaged channel layer may shift the threshold voltage of the TFT to a higher negative value. This may cause a relatively large leakage current to flow between the source and drain electrodes even when a gate voltage is about 0 V. The damage to the channel layer shifting the threshold voltage may be related to the increase in carrier concentration in the channel layer.

SUMMARY

Example embodiments relate to thin film transistors (TFTs), for example, ZnO-based TFTs and methods of manufacturing the same.

ZnO-based TFTs according to example embodiments may suppress and/or prevent channel layer damage resulting from plasma or the like, and methods of manufacturing the same.

According to at least one example embodiment a ZnO-based TFT may include a channel layer formed on a substrate. The channel layer may include a stack of ZnO-based semiconductor layers. A gate may be disposed between the substrate and the channel layer. A gate insulating layer may be disposed between the channel layer and the gate. A source electrode and a drain electrode may be disposed on respective sides of the channel layer. A passive layer may cover the channel layer, the source electrode and the drain electrode. An uppermost semiconductor layer of the channel layer may have a Zn concentration less than lower semiconductor layers.

According to at least some example embodiments, the uppermost semiconductor layer of the channel layer may include a tin (Sn) oxide. The uppermost semiconductor layer of the channel layer may include a chloride. The ZnO-based TFT may further include ohmic layers disposed between the channel layer and the source electrode and between the channel layer and the drain electrode. The chloride may be formed near a surface of the channel layer.

At least one other example embodiment provides a method of manufacturing a ZnO-based TFT. An example embodiment may include forming a ZnO-based channel layer on a substrate; forming a gate between the substrate and the channel layer; disposing a gate insulating layer between the channel layer and the gate; forming a source electrode and a drain electrode on respective sides of the channel layer; and covering the channel layer, the source electrode, and the drain electrode with a passive layer. The forming of the channel layer may include forming a plurality of ZnO-based semiconductor layers, wherein an uppermost semiconductor layer of the channel layer may have a Zn concentration less than that of lower semiconductor layers.

At least one other example embodiment provides a method of manufacturing a ZnO-based TFT. At least this example embodiment may include forming a gate on a substrate and forming a gate insulating layer covering the gate on the substrate; forming a ZnO-based channel material layer on the gate insulating layer; forming on the channel material layer a mask layer having a pattern corresponding to a channel region and source and drain regions contacting respective sides of the channel region; patterning the channel material layer using the mask layer to form a channel layer; removing the source and drain regions from the mask layer to expose both sides of the channel layer; performing plasma treatment on the exposed sides of the channel layer not covered by the mask layer to form ohmic contact layers; removing the mask layer and forming source and drain electrodes covering the ohmic contact layers on both sides of the channel layer; and forming a passive layer covering the channel layer and the source and drain electrodes. The ZnO-based channel material layer may include a ZnO-based lower semiconductor layer and a ZnO-based upper semiconductor layer having a Zn concentration less than that of the ZnO-based lower semiconductor layer, According to at least some example embodiments, the channel region of the mask layer may be thicker than the source and drain regions. The removing of the source and drain regions from the mask layer may include ashing the mask layer and removing the source and drain regions. The mask layer with the various thicknesses may be formed using a halftone mask. A Sn oxide may be included in the upper semiconductor layer of the channel material layer.

According to at least some example embodiments, the channel layer may be formed by physical vapor deposition (PVD) including sputtering and evaporation. The gate insulating layer may be formed of silicon nitride ($SiN_x$). The channel layer may be formed of gallium-indium-zinc-oxide (GIZO), and the gate insulating layer may be formed of $SiN_x$.

According to at least some example embodiments, the forming of the source and drain electrodes may include patterning the channel material layer by dry etching using etching gas including any one of chlorine (Cl) gas and fluorine (F) gas; and inducing bonding between a material of the channel material layer and any one of Cl and F of the etching gas in the channel layer exposed to the plasma gas during the patterning to form any one of a chloride and a fluoride in the channel layer.

According to at least some example embodiments, the ZnO-based channel layer may be $a(In_2O_3) \cdot b(Ga_2O_3) \cdot c(ZnO)$ layer where a, b, and c are real numbers satisfying $a \geq 0$, $b \geq 0$, and $c > 0$. Alternatively, the channel layer may be a $a \geq (In_2O_3) \cdot b(Ga_2O_3) \cdot c(ZnO)$ layer, where a, b, and c are real numbers satisfying $a \geq 1$, and $b \geq 1$, and $0 < c \leq 1$. The chloride may include at least one selected from the group consisting of $GaCl_3$, $InCl_3$, and $ZnCl_2$, or $GaCl_x$, $InCl_x$, and $ZnCl_y$, where $0 < x \leq 3$ and $0 < y \leq 2$. The fluoride may include at least one selected from the group consisting of $GaF_3$, $InF_3$, and $ZnF_2$, or $GaF_x$, $InF_x$, $ZnF_y$, where $0 < x \leq 3$ and $0 < y \leq 2$.

According to at least some example embodiments, a first portion of the channel layer is formed directly on the gate and a second portion of the channel layer is formed directly on the substrate.

BRIEF DESCRIPTION OF THE DRAWINGS

Example embodiments will become more apparent by describing in detail the example embodiments shown in the attached drawings in which.

DETAILED DESCRIPTION OF EXAMPLE EMBODIMENTS

Figure 1:
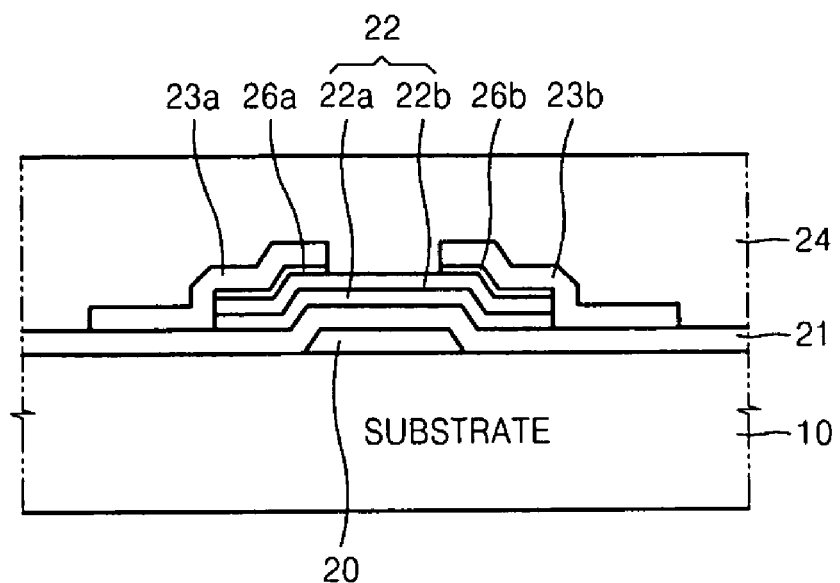
FIG. 1 is a cross-sectional view of a ZnO-based thin film transistor (TFT) according to an example embodiment.

Various example embodiments will now be described more fully with reference to the accompanying drawings in which some example embodiments are shown. In the drawings, the thicknesses of layers and regions are exaggerated for clarity.

Detailed illustrative example embodiments are disclosed herein. However, specific structural and functional details disclosed herein are merely representative for purposes of describing example embodiments. This invention may, however, may be embodied in many alternate forms and should not be construed as limited to only the example embodiments set forth herein.

Accordingly, while example embodiments are capable of various modifications and alternative forms, embodiments thereof are shown by way of example in the drawings and will herein be described in detail. It should be understood, however, that there is no intent to limit example embodiments to the particular forms disclosed, but on the contrary, example embodiments are to cover all modifications, equivalents, and alternatives falling within the scope of the invention. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or," includes any and all combinations of one or more of the associated listed items.

It will be understood that when an element or layer is referred to as being "formed on," another element or layer, it can be directly or indirectly formed on the other element or layer. That is, for example, intervening elements or layers may be present. In contrast, when an element or layer is referred to as being "directly formed on," to another element, there are no intervening elements or layers present. Other words used to describe the relationship between elements or layers should be interpreted in a like fashion (e.g., "between," versus "directly between," "adjacent," versus "directly adjacent," etc.).

The terminology used herein is for the purpose of describing particular embodiments only and is not intended to be limiting of example embodiments. As used herein, the singular forms "a," "an," and "the," are intended to include the plural forms as well, unless the context clearly indicates otherwise. It will be further understood that the terms "comprises," "comprising," "includes," and/or "including," when used herein, specify the presence of stated features, integers, steps, operations, elements, and/or components, but do not preclude the presence or addition of one or more other features, integers, steps, operations, elements, components, and/or groups thereof.

FIG. 1 is a cross-sectional view of a bottom gate ZnO-based thin film transistor (TFT) according to an example embodiment.

Referring to FIG. 1, a gate 20 may be formed on a substrate 10. A gate insulating layer 21 covering the gate 20 may be formed on the substrate 10. A channel layer 22 corresponding to the gate 20 may be formed on the gate insulating layer 21. The substrate 10 may be formed of a transparent or opaque material such as silicon, glass, plastic or the like. The channel layer 22 may be referred to as a ZnO-based channel layer and may include a stack of semiconductor layers 22a and 22b. The uppermost semiconductor layer 22b may have a Zn concentration less than that of the lower semiconductor layer 22a. The lower semiconductor layer 22a may be a single semiconductor layer or a plurality of semiconductor layers arranged in a stack structure.

The ZnO-based semiconductor layers 22a and 22b may be formed of a ZnO-based material such as gallium-indium-zinc-oxide (GIZO) or the like. For example, the ZnO-based semiconductor layers 22a and 22b may be formed of a GIZO material such as a(In2O3).b(Ga2O3).c(ZnO). The channel layer 22 may be formed by physical vapor deposition (PVD) including sputtering and evaporation. The uppermost semiconductor layer 22b may include a tin (Sn) oxide, which will be explained later in detail.

A source electrode 23a and a drain electrode 23b may be formed on sides of the channel layer 22. The source electrode 23a and the drain electrode 23b may extend to portions of the substrate 10 not covered by the channel layer 22. Each of the source electrode 23a and the drain electrode 23b may be, for example, metal layers. The metal layers may be formed of any one selected from the group consisting of or including a copper (Cu) or molybdenum (Mo) single metal layer, a multi-metal layer including a Mo layer, a metal layer including titanium (Ti), a metal layer including chromium (Cr) or the like.

A relatively thick passive layer 24 may be formed on the channel layer 22, the source electrode 23a and the drain electrode 23b. The passive layer 24 may be formed by plasma enhanced chemical vapor deposition (PECVD) or the like.

The channel layer 22, the source electrode 23a, the drain electrode 23b, the gate insulting layer 21, and the gate 20 may have thicknesses of about 30-200 nm, about 10-200 nm, about 10-200 nm, about 100-300 nm, and about 100-300 nm, respectively.

Ohmic contact layers 26a and 26b may be disposed between the channel layer 22 and the source electrode 23a and between the channel layer 22 and the drain electrode 23b, respectively. The ohmic contact layers 26a and 26b may be conductive oxide layers having an oxygen content less than that of the channel layer 22. The ohmic contact layers 26a and 26b may reduce contact resistance between the channel layer 22 and the source electrode 23a and between the channel layer 22 and the drain electrode 23b. The ohmic contact layers 26a and 26b may also suppress and/or prevent holes from escaping from the channel layer 22.

In the bottom gate ZnO-based TFT constructed as described above, the uppermost semiconductor layer 22b of the channel layer 22 may contain a Sn oxide. The ZnO concentration in the uppermost semiconductor layer 22b may also be reduced. SnO, which may have a relatively high bonding energy and higher stability against plasma than ZnO, may reduce an oxygen vacancy in the oxide, for example, ZnO. Accordingly, the amount of ZnO having relatively low bonding energy may be reduced, and thus, the quantity of ZnO decomposed by plasma may be reduced, thereby suppressing an increase in carriers.

Figure 2:
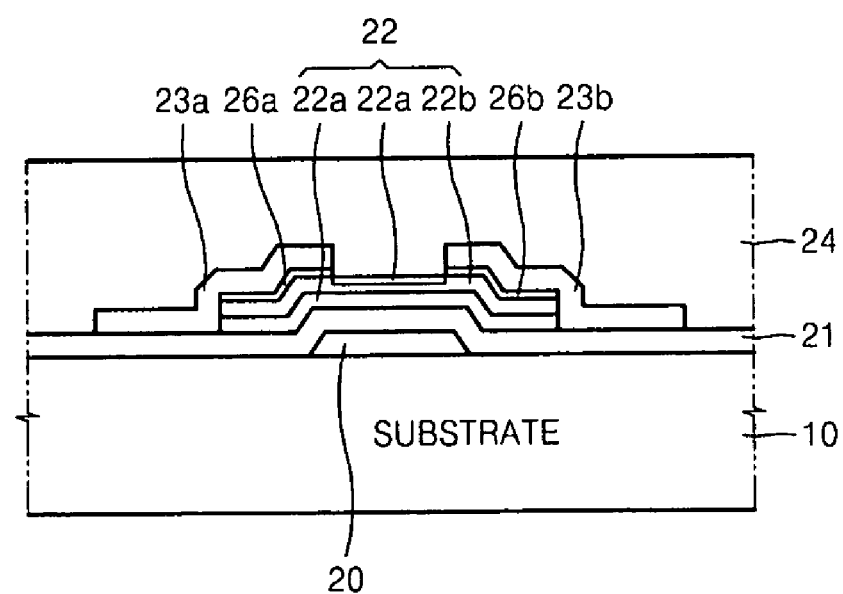
FIG. 2 is a cross-sectional view of a ZnO-based TFT according to another example embodiment.

FIG. 2 is a cross-sectional view of a bottom gate ZnO-based TFT according to another example embodiment.

Referring to FIG. 2, a gate 20 may be formed on a substrate 10. A gate insulating layer 21 covering the gate 20 may be formed on the substrate 10. A channel layer 22 corresponding to the gate 20 may be formed on the gate insulating layer 21. The substrate 10 may be formed of a transparent or opaque material such as silicon, glass, plastic or the like. The channel layer 22 may include a plurality of semiconductor layers 22a, 22b and 22c arranged in a stack structure. Although only three layers 22a, 22b and 22c are shown in FIG. 2, the channel layer 22 may include any number of layers (e.g., 4, 5, . . . , n, where n is a natural number) arranged in a stack structure. The uppermost semiconductor layer 22c and the intermediate semiconductor layer 22b may have a Zn concentration less than that of the lower semiconductor layer 22a. The lower semiconductor layer 22a may be a single semiconductor layer or a plurality of semiconductor layers arranged in a stack structure. The intermediate semiconductor layer 22b and the uppermost semiconductor layer 22c may include a Sn oxide. The uppermost semiconductor layer 22c may further include a chloride, a fluoride or the like.

The ZnO-based semiconductor layers 22a, 22b, and 22c may be formed of a ZnO-based material such as GIZO or the like. For example, the ZnO-based semiconductor layers 22a, 22b, and 22c may include a GIZO material such as a(In2O3).b(Ga2O3).c(ZnO). The GIZO channel layer 22 may be formed by, for example, PVD including sputtering and evaporation.

A source electrode 23a and a drain electrode 23b may be formed on respective sides of the channel layer 22. The source electrode 23a and the drain electrode 23b may extend to portions of the substrate 10 not covered by the channel layer 22. Each of the source electrode 23a and the drain electrode 23b may be a metal layer. The metal layer may be any one selected from the group consisting of or including a Cu or Mo single metal layer, a multi-metal layer including a Mo layer, a metal layer including Ti, a metal layer including Cr, a combination thereof or the like.

A thick passive layer 24 may be formed on the channel layer 22, the source electrode 23a and the drain electrode 23b. The passive layer 24 may be formed by PECVD or the like.

Ohmic contact layers 26a and 26b may be disposed between the channel layer 22 and the source electrode 23a and between the channel layer 22 and the drain electrode 23b, respectively. The channel layer 22, the source electrode 23a, the drain electrode 23b, the gate insulting layer 21, and the gate 20 may have thicknesses of about 30-200 nm, about 10-200 nm, about 10-200 nm, about 100-300 nm, and about 100-300 nm, respectively.

The chloride included in the uppermost semiconductor layer 22c may include at least one selected from the group consisting of or including GaCl3, InCl3 and ZnCl2, or GaClx, InClx, and ZnCly, where x may be between about 0 and about 3, inclusive, and y may be between about 0 and about 2, inclusive (e.g., 0<x≦3 and 0<y≦2). The fluoride may include at least one selected from the group consisting of or including GaF3, InF3, and ZnF2, or GaFx, InFx, and ZnFy, where x may be between about 0 and about 3, inclusive, and y may be between about 0 and about 2, inclusive, (e.g., 0<x≦3 and 0<y≦2).

The Sn oxide may be included in the intermediate semiconductor layer 22b and the uppermost semiconductor layer 22c when depositing the semiconductor material. In one example, the semiconductor layers 22b and 22c including the Sn oxide may be obtained by depositing a SnO target together with Ga2O3, In2O3, and ZnO targets using sputtering and evaporation or similar processes. For example, the ZnO-based channel layer 22 may be deposited by radio frequency (RF) sputtering. In this example, RF power may be between about 100 W and about 500 W, inclusive. A gas introduced into a chamber during the sputtering may be argon (Ar) and diatomic oxygen (O2). When the flow rate of Ar is about 100 sccm, the flow rate of O2 may range between about 0 and about 100 sccm, inclusive.

The chloride or the fluoride included in the uppermost semiconductor layer 22c may be formed during patterning using plasma to form the source electrode 23a and the drain electrode 23b. The patterning for forming the source electrode 23a and the drain electrode 23b may be performed by dry etching using chlorine (Cl)-based or fluorine (F)-based etching gas. In this example, when the GIZO of the channel layer 22 exposed to the plasma is damaged and an oxygen vacancy occurs in a grating structure, Cl or F may be filled in the resultant empty space of the grating structure. Due to the use of the Cl- or F-based etching gas, the GIZO of the channel layer 22 may be partially converted into Ga—In—Zn—Cl (GIZCl) or Ga—In—Zn—F (GIZF) in the uppermost semiconductor layer 22c damaged by the plasma. When using reactive ion etching (RIE) to form the source electrode 23a and the drain electrode 23b, the power may be between about 100 and about 1000 W, inclusive, a process pressure using a gas mixture of Cl- or F-based gas and oxygen as reactive gas may be between about 10 and about 100 mTorr, inclusive, and the flow rate of the oxygen may be greater than or equal to about 10 sccm. The GIZCl has higher bonding energy than the GIZO, and thus, the GIZCl may be more stable than the GIZO against the plasma.

During the patterning of the source electrode 23a and the drain electrode 23b, the ZnO-based channel layer 22 may include a chloride, a fluoride or the like. Chlorides $GaCl_3$, $InCl_3$, and $ZnCl_2$, or fluorides $GaF_3$, $InF_3$, or $ZnF_2$ may have higher bonding energy than $Ga_2O_3$, $In_2O_3$, ZnO as shown in Table 1.

TABLE 1

| Element | Bonding Energy (kJ/mol at room temperature) | | | Comparison |
|---|---|---|---|---|
| | Oxide | Chloride | Fluoride | |
| Ga | 354 | 481 | | oxide < chloride |
| In | 320 | 439 | | oxide < chloride |
| Zn | 159 | 229 | 368 | oxide < chloride < fluoride |

Accordingly, when a $SiN_X$ passive layer 24 is formed using PECVD after patterning the channel layer 22, the channel layer 22 exposed to plasma may be better protected. If the chloride or the fluoride having high bonding energy and relatively high stability against plasma is present near the surface of the channel layer 22 (as is the case in example embodiments), an oxygen vacancy resulting from damage due to plasma and an increase in carrier concentration may also be suppressed and/or prevented. Referring to Table 1, because ZnO has the lowest relative bonding energy, ZnO may be the first to decompose into Zn by plasma, the increase in carrier concentration due to the Zn may be the greatest, and bonding between the Zn and Cl may be more common.

To suppress and/or prevent an increase in carrier concentration due to ZnO having the lowest bonding energy, a larger amount of ZnCl may be distributed near the surface of the channel layer 22 and the concentration of ZnO that is more easily decomposed may be reduced. The Sn oxide included in the semiconductor layers 22b and 22c has a relatively high bonding energy of 532 kJ/mol, which may plasma suppress damage to the channel layer.

Example embodiments are discussed herein with respect to a bottom gate back channel etching (BCE) TFT in which a gate is formed under a channel layer. At least one example embodiment provides a bottom gate BCE TFT in which Zn concentration having a relatively low bonding energy in a channel layer may be reduced and an Sn oxide, a chloride or a fluoride having a relatively high bonding energy may be formed near a surface of the channel layer to suppress and/or prevent plasma damage to the channel layer.

A method of manufacturing a ZnO-based TFT according to example embodiments will now be described.

FIGS. 3A through 3F are cross-sectional views illustrating a method of manufacturing a ZnO-based TFT according to an example embodiment. The same reference numerals in FIGS. 1 and 3A through 3F denote the same elements.

Figure 3A:
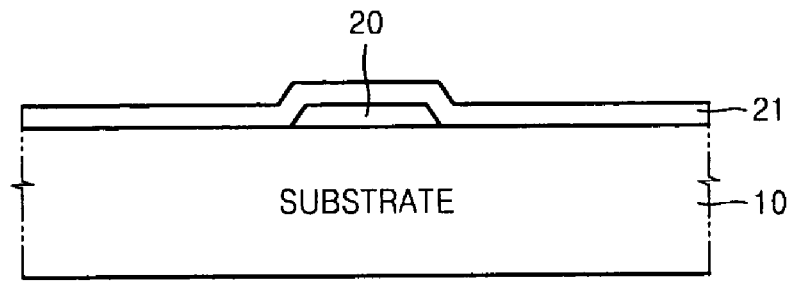
FIGS. 3A through 3F are cross-sectional views illustrating a method of manufacturing a TFT according to an example embodiment.

Referring to FIG. 3A, a gate 20 may be formed on a substrate 10. A $SiO_2$ or $SiN_X$ gate insulating layer 21 may be formed on the substrate 10. The gate insulating layer 21 may cover the gate 20. Wet cleaning may be performed to remove impurities from a top surface of the gate insulating layer 21. A cleaning solution used in the wet cleaning may be at least one of isopropyl alcohol (IPA), deionized water, aceton or the like.

Figure 3B:
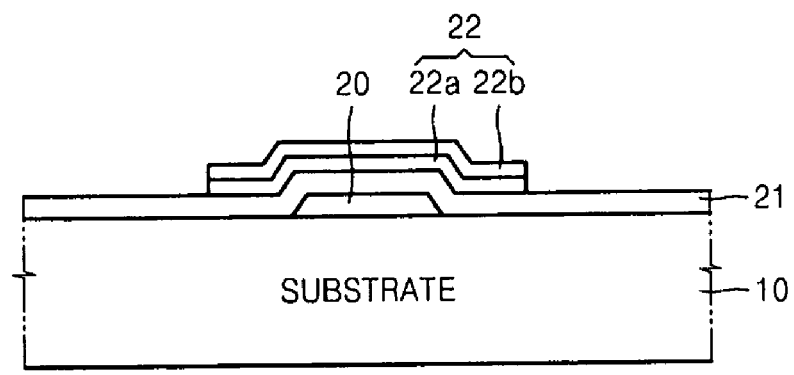

Referring to FIG. 3B, a channel layer 22 corresponding to the gate 20 may be formed on the gate insulating layer 21 such that the channel layer 22 is disposed on the gate insulating layer 21 over the gate 20. The channel layer 22 may be formed, for example, using PVD (e.g., including sputtering and evaporation) or the like. In one example, the channel layer 22 may be formed by sputtering at least one target of $In_2O_3$, $Ga_2O_3$, ZnO, or the like. Accordingly, a GIZO material may be the main material in the channel layer 22. The channel layer 22 may include a lower semiconductor layer 22a and an upper semiconductor layer 22b arranged in a stack structure. The upper semiconductor layer 22b may have a lower Zn concentration than the lower semiconductor layer 22a. Because the upper semiconductor layer 22b has a Zn concentration less than that of the lower semiconductor layer 22a, the upper and lower semiconductor layers 22b and 22a may have different amounts of ZnO target in the same chamber.

Figure 3C:
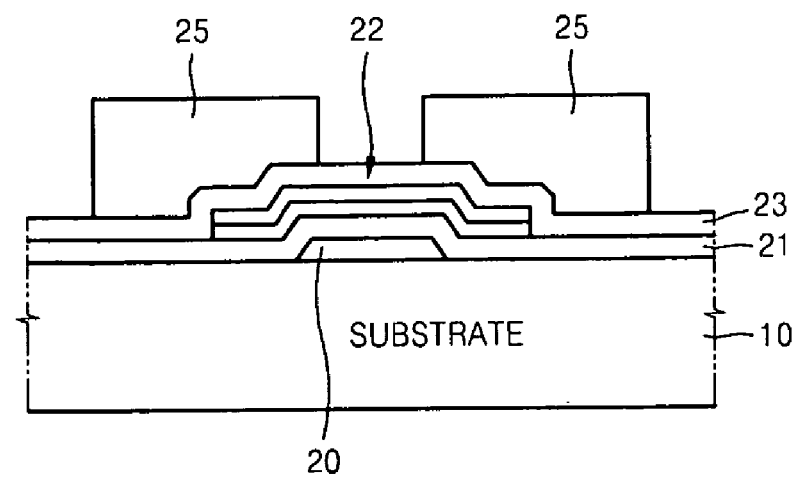

Referring to FIG. 3C, a metal layer 23 covering the channel layer 22 may be formed on the gate insulating layer 21, and a photoresist mask 25 for forming a source electrode 23a and a drain electrode 23b may be formed on the metal layer 23. The metal layer 23 may be, for example, any one of a Mo single metal layer, a multi-layer metal layer including a molybdenum layer, a metal layer including Ti, a metal layer including Cr or the like. Alternatively, Pt, Cu, Al, W, MoW, AlNd, Ni, Ag, Au, IZO, ITO, a silicide thereof or the like may be used. The metal layer 23 may be formed using PVD or the like.

If ohmic contact layers are not formed during the forming of the source electrode 23a and the drain electrode 23b, annealing may be performed after the source electrode 23a and the drain electrode 23b are formed. A reaction between the source electrode 23a and the drain electrode 23b may occur due to the annealing, thereby forming the ohmic contact layers.

Figure 3D:
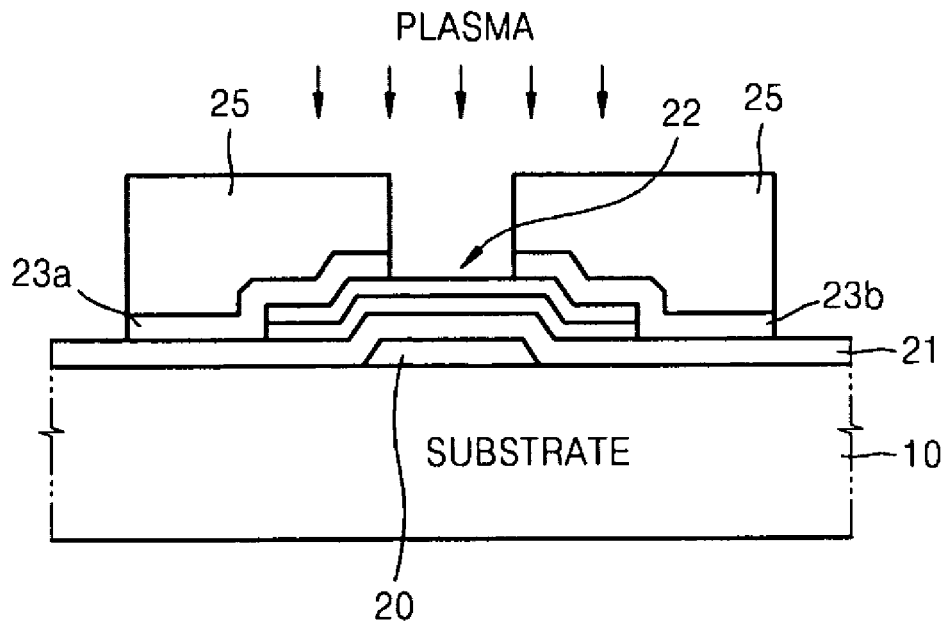

Referring to FIG. 3D, an exposed portion of the metal layer 23 not covered by the mask 25 may be removed by dry etching using etching gas to form the source electrode 23a and the drain electrode 23b contacting respective sides of the channel layer 22 on the gate insulating layer 21. The etching gas may include a Cl- or F-based gas. In addition to the Cl- or F-based gas, at least one of oxygen, nitrogen, $SF_6$, F-based gas, I-based gas, Br-based gas, Ar, Xe, Kr or the like may be mixed in the etching gas. When a gas mixture of chlorine-based gas or fluorine-based gas and oxygen is used, the partial pressure ratio of the chlorine-based gas and the oxygen or the partial pressure ratio of the chlorine-based gas and the fluorine-based gas may range from about 0.001 to about 0.99, inclusive. When the gate insulating layer 21 is formed of $SiN_x$, $SF_6$ may be omitted because $SF_6$ has etchability with respect to $SiN_x$ as well as metal, such as Mo, and thus the gate insulating layer 21 may be etched by the $SF_6$ during the patterning for forming the source and drain electrodes 23a and 23b.

When the source electrode 23a and the drain electrode 23b are formed by plasma etching, a region where GIZO is converted into GIZCl or GIZF may be formed near a surface of the channel layer 22 exposed to the plasma.

Figure 3E:
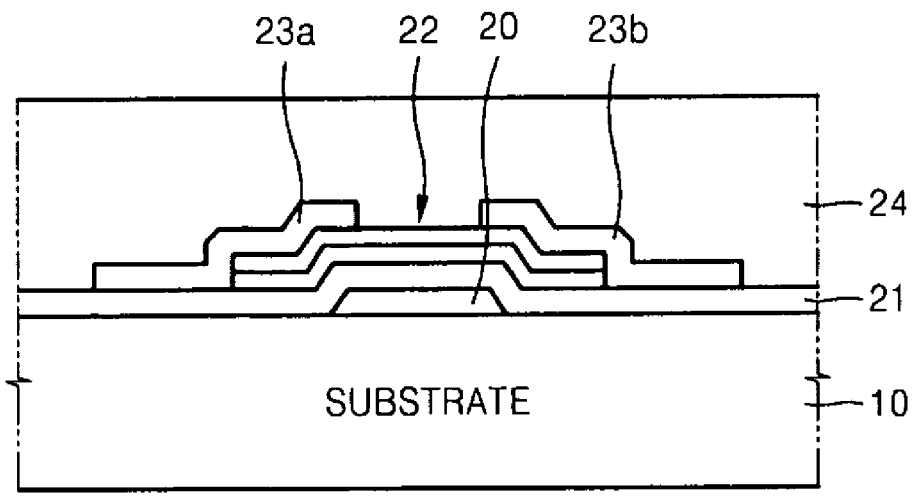

Referring to FIG. 3E, a passive layer 24 covering the source electrode 23a and the drain electrode 23b may be formed on the gate insulating layer 21. The passive layer 24 may be formed using PECVD or the like.

Figure 3F:
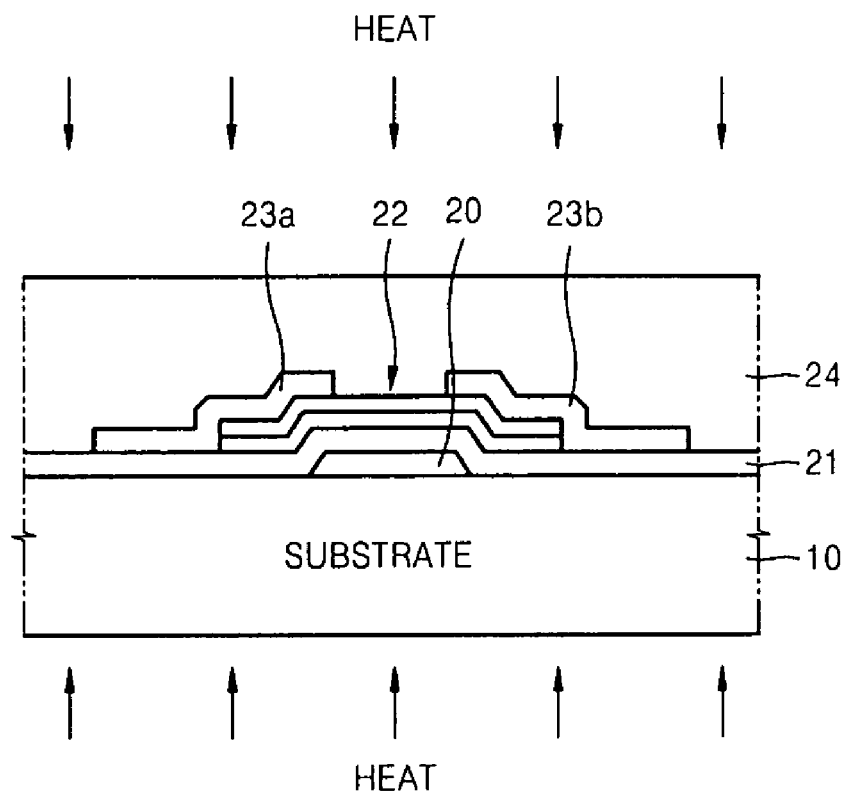

Referring to FIG. 3F, the channel layer 22 and the passive layer 24 may be subjected to annealing or similar process. The annealing may be furnace annealing or rapid thermal annealing (RTA), and may be performed for about 10 minutes to about 2 hours, inclusive, at a temperature of about 200° C. to about 400° C., inclusive, in an oxygen or nitrogen atmosphere. In one example, the annealing may be performed for about 1 hour at a temperature of about 200° C. The annealing may reduce carrier concentration in the channel layer 22, thereby obtaining a TFT having more desirable electrical properties and/or threshold voltage.

FIGS. 4A through 4I are cross-sectional views illustrating a method of manufacturing a TFT according to another example embodiment. The same reference numerals in FIG. 1 and FIGS. 4A through 4I denote the same elements.

Figure 4A:
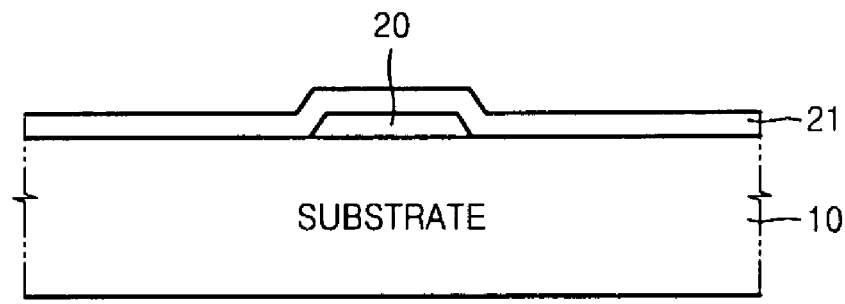
FIGS. 4A through 4I are cross-sectional views illustrating a method of manufacturing a TFT according to another example embodiment.

Referring to FIG. 4A, a gate 20 may be formed on a substrate 10. A $SiO_2$ or $SiN_x$ gate insulating layer 21 may be formed on the substrate 10. The gate insulating layer 21 may cover the gate 20. Wet cleaning may be performed to remove impurities from on a top surface of the gate insulating layer 21. A cleaning solution used in the wet cleaning may be at least one of IPA, deionized water, aceton or the like.

Figure 4B:
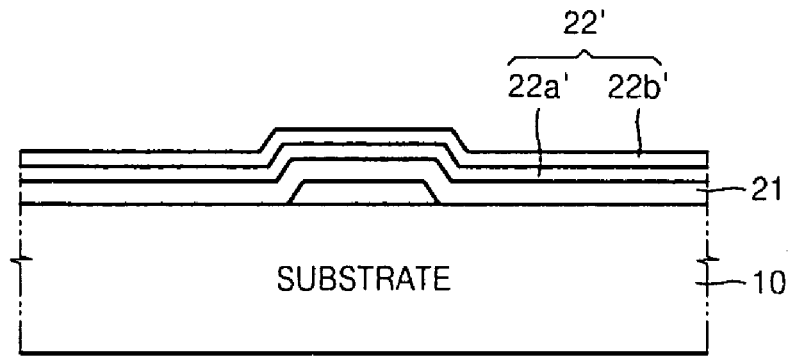

Referring to FIG. 4B, upper and lower semiconductor material layers 22a' and 22b' for forming a channel layer 22 corresponding to the gate 20 may be formed on the gate insulating layer 21. The semiconductor material layers 22a' and 22b' may be formed by PVD (e.g., including sputtering and evaporation) or the like. The semiconductor material layers 22a' and 22b' may be formed by sputtering at least one target of $In_2O_3$, $Ga_2O_3$, ZnO or the like. As described above, because the upper semiconductor layer 22b' has a Zn concentration less than that of the lower semiconductor layer 22a', the upper and lower semiconductor layers 22b' and 22a' may have different amounts of ZnO target. The upper semiconductor material layer 22b' may further include a SnO target. Because SnO has higher stability against plasma than ZnO, an oxygen vacancy occurring during plasma treatment may be reduced.

Figure 4C:
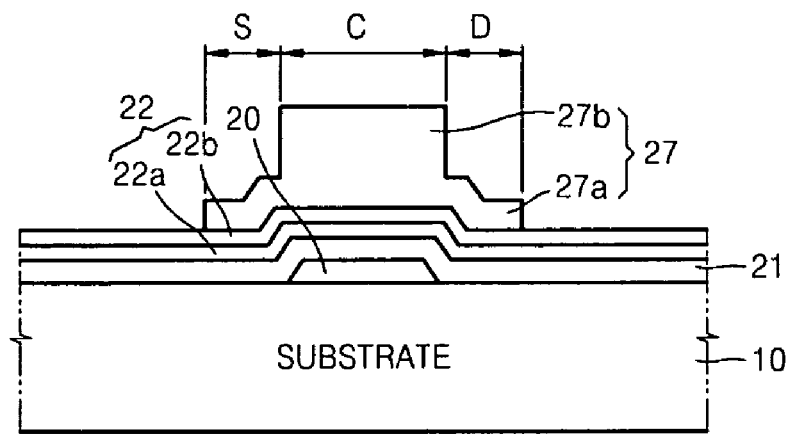

Referring to FIG. 4C, a mask 27 for forming a channel layer corresponding to the gate 20 may be formed on the gate insulating layer 21. The mask 27 may have a channel region c, a source region s and a drain region d. The channel region c may be thicker than the source region s and the drain region d. This pattern of the mask 27 may be formed using a conventional halftone mask or the like.

Figure 4D:
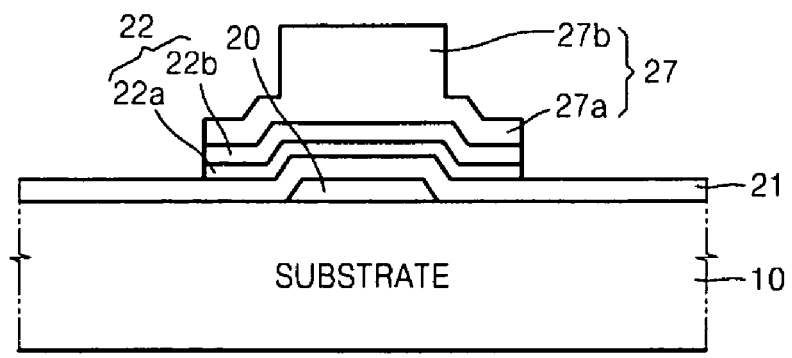

Referring to FIG. 4D, exposed portions of the semiconductor material layers 22a' and 22b' not covered by the mask 27 may be removed by wet or dry etching to form a channel layer 22 having a lower semiconductor layer 22a and an upper semiconductor layer 22b.

Figure 4E:
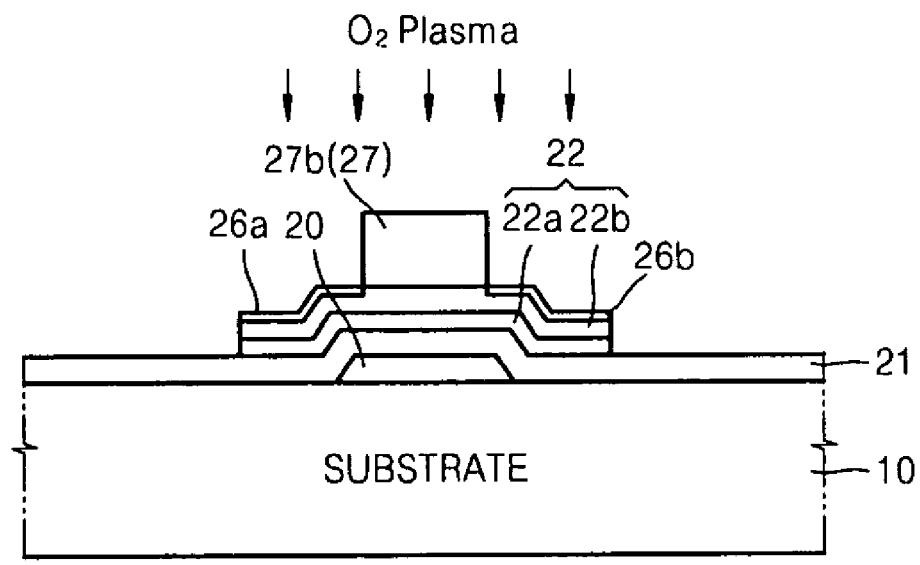

Referring to FIG. 4E, the mask 27 may be etched by a uniform or substantially uniform amount to remove the relatively thin regions (e.g., the source region s and the drain region d), and expose both sides of the channel layer 22. The thin regions of the mask 27 may be removed using conventional ashing or the like. The exposed upper semiconductor layer 22b of the channel layer 22 may be subjected to plasma treatment, for example, plasma treatment by which GIZO is not etched (e.g., plasma treatment using inactive gas) such as Ar, Xe, $N_2$, He, or the like, or reducing gas, such as $H_2$, $NH_3$, or the like to form ohmic contact layers 26a and 26b.

Figure 4F:
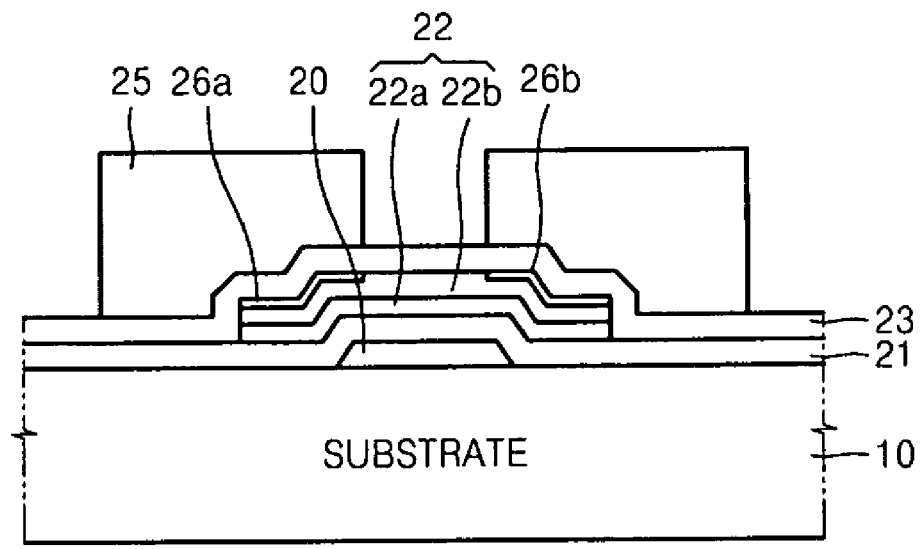

Referring to FIG. 4F, after the ohmic contact layers 26a and 26b are formed, the mask 27 may be removed, and a metal layer 23 may be formed over an entire surface of the channel layer 22. A mask 25 may be formed on the metal layer 23.

Figure 4G:
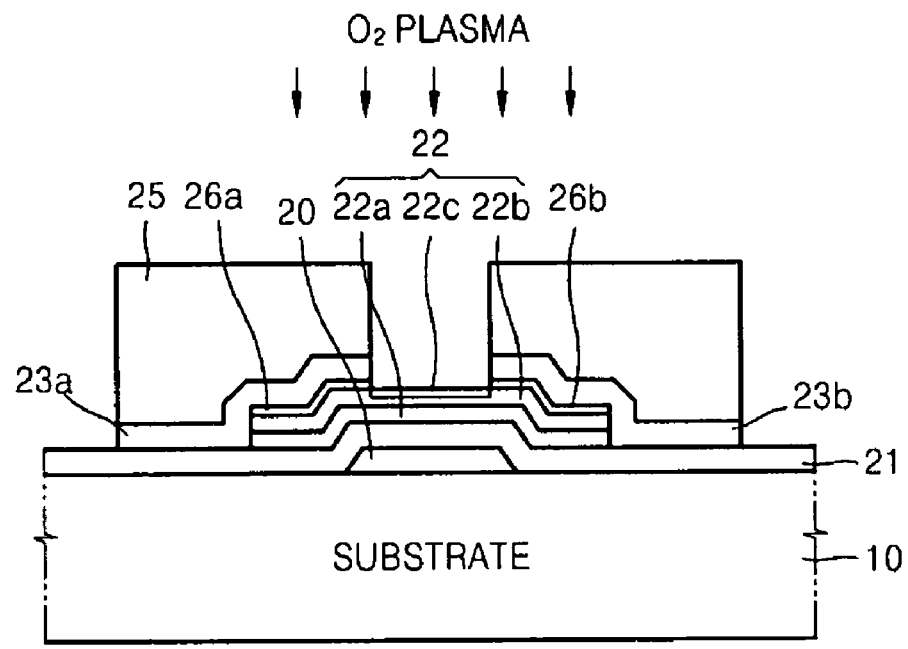

Referring to FIG. 4G, the metal layer 23 may be wet or dry etched using the mask 25 to form a source electrode 23a and a drain electrode 23b on respective sides of the channel layer 22. In at least one example, wet etching may be used because it may cause less damage to the channel layer 22. When wet etching is used, the metal layer 23 may be formed of, for example, Cu or the like.

When dry etching, the use of plasma may damage the channel layer 22. For example, when dry etching the use of oxygen plasma may damage a back channel layer if an exposed surface of the channel layer 22 is partially etched when patterning the source electrode 23a and the drain electrode 23b. To suppress and/or prevent the damage to the channel layer 22 and an increase in carrier concentration due to the plasma damage, Cl- or F-based gas may be included as described above. If the etching gas includes Cl- or F-based gas, Cl or F may react with Ga, In, and Zn of the channel layer 22 to form a chloride or a fluoride. As a result, an uppermost semiconductor layer 22c including a chloride or a fluoride may be formed as a product of the above-described reaction. Because the uppermost semiconductor layer 22c includes an Sn oxide, and Ga, In, and Zn chlorides or fluorides having a relatively high bonding energy, more stable bonding with respect to plasma may be achieved, and thus an oxygen vacancy may be suppressed and/or prevented.

The metal layer 23 may be any one selected from the group consisting of or including a Mo single metal layer, a multilayer metal layer including a Mo layer, a metal layer including Ti, a metal layer including Cr or the like. Alternatively, Pt, Cu, Al, W, MoW, AlNd, Ni, Ag, Au, IZO, ITO, a silicide thereof or the like may be used. The metal layer 23 formed of the material may be formed using PVD or the like.

The etching gas may include Cl- or F-based gas. At least one of oxygen, nitrogen, $SF_6$, F-based gas, I-based gas, Br-based gas, Ar, Xe, Kr or the like may be mixed in the Cl- or F-based gas. When a gas mixture of Cl-based gas or F-based gas and oxygen is used, the partial pressure ratio of the Cl-based gas and the oxygen or the partial pressure ratio of the Cl-based gas and the F-based gas may range from about 0.001 to about 0.99, inclusive. When the gate insulating layer 21 is formed of $SiN_x$, $SF_6$ may be omitted for the same or substantially the same reason as described above.

Figure 4H:
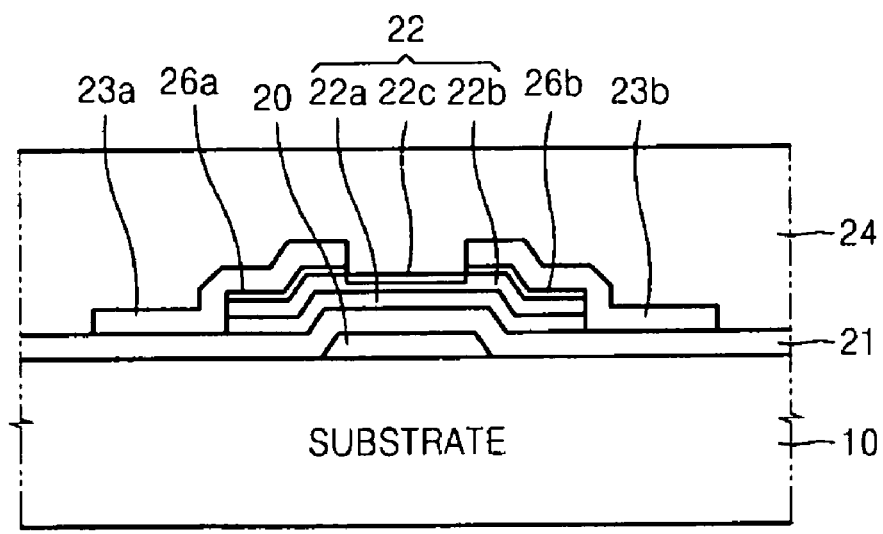

Referring to FIG. 4H, a passive layer 24 covering the channel layer 22, the source electrode 23a and the drain electrode 23b may be formed on the gate insulating layer 21. The passive layer 24 may be formed using PECVD.

Figure 4I:
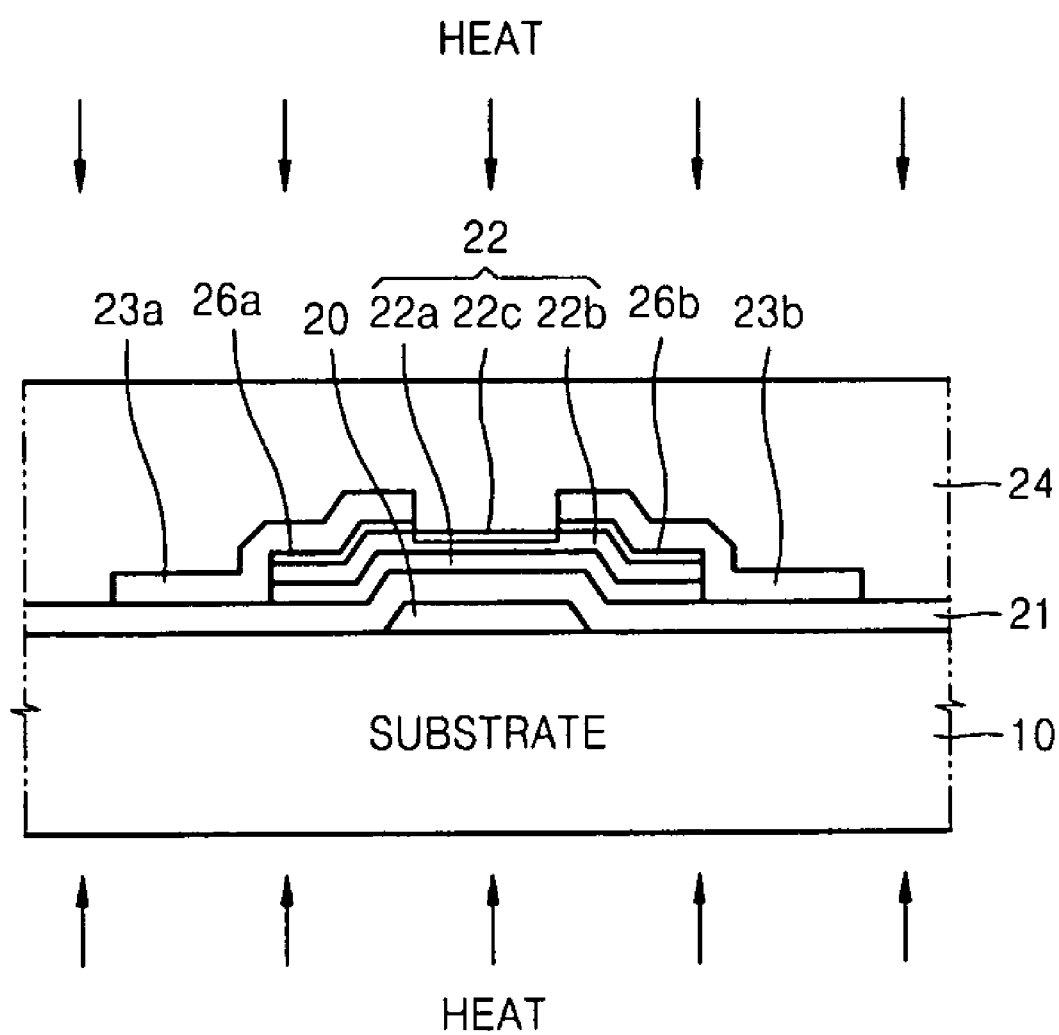

Referring to FIG. 4I, the channel layer 22 and the passive layer 24 may be subjected to annealing or the like. The annealing may be furnace annealing or RTA, and may be performed for about 10 minutes to about 2 hours, inclusive, at a temperature about 200° C. to about 400° C., inclusive, in an oxygen or nitrogen atmosphere. For example, the annealing may be performed for about 1 hour at a temperature of about 200° C. The annealing may reduce carrier concentration in the channel layer 22, thereby obtaining a TFT having more desirable electrical properties and/or threshold voltage.

As described above, TFTs according to example embodiments may include an uppermost semiconductor layer having a relatively low Zn concentration and higher stability against plasma, which may suppress and/or prevent an increase in carrier concentration due to plasma damage to the channel layer. A chloride or a fluoride having relatively high bonding energy may be formed in the uppermost semiconductor layer to further suppress and/or prevent plasma damage. Accordingly, example embodiments of TFTs may have more desirable electrical properties by more effectively suppressing and/or preventing the plasma damage.

TFTs according to example embodiments may be applied to liquid crystal displays (LCDs) and/or an organic light-emitting diodes (OLEDs), which may require a relatively large switching element. For example, TFTs according to example embodiments may be used as oxide semiconductor TFT substituting for a conventional amorphous silicon TFT (a-Si TFT), poly silicon TFT (poly-Si TFT) or the like, and may be applied to a flat panel display, for example, to an LCD, an OLED or the like, which may require a TFT-based switching and/or driving element.

TFTs according to example embodiments may also be applicable to cellular phones, mobile devices, notebook computers, monitors, televisions (TVs) or other electronic device including LCDs, OLEDs or the like.

While the present invention has been particularly shown and described with reference to example embodiments thereof, it will be understood by those of ordinary skill in the art that various changes in form and details of TFTs according to example embodiments may be made therein and TFTs according to example embodiments may be applied to memory devices and/or logic devices as well LCDs, OLEDs or the like without departing from the spirit and scope of the present invention as defined by the following claims.

What is claimed is:

1. A method of manufacturing a thin-film-transistor (TFT), the method comprising:
    forming a zinc oxide (ZnO)-based channel layer on a substrate, the ZnO-based channel layer including a plurality of ZnO-based semiconductor layers, a Zn concentration of an uppermost semiconductor layer of the plurality of ZnO-based semiconductor layers less than a Zn concentration of at least one other of the plurality of semiconductor layers;
    forming a source electrode and a drain electrode at respective sides of the channel layer; and
    forming a passive layer covering the channel layer, the source electrode, and the drain electrode.

2. The method of claim 1, wherein the uppermost semiconductor layer includes a Sn oxide.

3. The method of claim 1, wherein the uppermost semiconductor layer includes at least one of a chloride and a fluoride.

4. The method of claim 3, wherein the uppermost semiconductor layer includes Sn oxide.

5. The method of claim 1, wherein the ZnO-based channel layer is gallium-indium-zinc-oxide (GIZO).

6. The method of claim 1, wherein the forming of the source electrode and the drain electrode includes,
    forming a metal layer,
    forming a mask having a pattern corresponding to the channel layer on the metal layer, and
    patterning the metal layer using the mask to form a source electrode and a drain electrode.

7. The method of claim 6, wherein the patterning of the metal layer includes,
    etching the metal layer using an etch gas containing at least one of a chlorine (Cl)-based gas and a fluorine (F)-based gas.

8. The method of claim 1, further comprising:
    forming a gate on the substrate; and
    forming a gate insulating layer covering the gate on the substrate,
    wherein the forming of the ZnO-based channel layer includes forming a ZnO-based channel material layer on the gate insulating layer, the ZnO-based channel material layer including a ZnO-based lower semiconductor layer and a ZnO-based upper semiconductor layer, a Zn concentration of the ZnO-based upper semiconductor layer less than a Zn concentration of the ZnO-based lower semiconductor layer,
    forming a mask layer on the channel material layer, the mask layer having a pattern corresponding to a channel, source and drain regions, the source and drain regions contacting respective sides of the channel region, and
    patterning the channel material layer using the mask layer to form a channel layer.

9. The method of claim 8, wherein the forming of the source and drain electrodes includes,
    patterning the channel material layer by dry etching using an etch gas including a least one of a Cl-based gas and a F-based gas, and
    inducing bonding between at least one material in the channel material layer and at least one of Cl and F in the etch gas on a portion of the channel layer exposed to the plasma gas during the patterning, the induced bonding forming at least one of a chloride and a fluoride in the channel layer.

10. The method of claim 8, further comprising:
    removing the source and drain regions from the mask layer to expose sides of the channel layer;
    performing plasma treatment on the exposed sides of the channel layer to form ohmic contact layers;
    removing the mask layer; and forming source and drain electrodes covering the ohmic contact layers on both sides of the channel layer.

11. The method of claim 10, wherein a portion of the mask layer corresponding to the channel region is thicker than portions of the mask layer corresponding to the source and drain regions, and
    the source and drain regions are removed from the mask layer by ashing the mask layer.

12. The method of claim 1, further comprising:
    forming a gate on the substrate; and
    forming a gate insulating layer covering the gate,
    wherein a first portion of the channel layer is formed directly on the gate and a second portion of the channel layer is formed directly on the substrate.

* * * * *